(12) United States Patent  
Huang et al.

(10) Patent No.: US 7,705,701 B2
(45) Date of Patent: Apr. 27, 2010

(54) THIN METAL LAYER VACUUM VESSELS WITH COMPOSITE STRUCTURAL SUPPORT

(75) Inventors: Xianrui Huang, Clifton Park, NY (US); William Daniel Barber, Clifton Park, NY (US); Paul St. Mark Shadforth Thompson, Stephentown, NY (US); Evangelos Trifon Laskaris, Schenectady, NY (US); Kiruba Sivasubramaniam, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1175 days.

(21) Appl. No.: 11/183,274

(22) Filed: Jul. 15, 2005

(65) Prior Publication Data

US 2007/0014946 A1 Jan. 18, 2007

(51) Int. Cl.
H01F 7/00 (2006.01)
H01F 1/00 (2006.01)
H01F 6/00 (2006.01)

(52) U.S. Cl. .................. 335/216; 335/294; 324/200; 324/248

(58) Field of Classification Search ............... 335/216, 335/294; 324/200, 248
See application file for complete search history.

(56) References Cited

U.S. PATENT DOCUMENTS

| 3,214,249 | A | * | 10/1965 | Fisher et. al. | 428/539.5 |
| 3,626,341 | A | * | 12/1971 | Dao | 335/216 |
| 3,946,348 | A | * | 3/1976 | Schleich | 335/216 |
| 4,044,457 | A | * | 8/1977 | Strauss et al. | 29/599 |
| 4,492,090 | A | | 1/1985 | Laskaris | |
| 4,640,005 | A | * | 2/1987 | Mine et al. | 29/599 |
| 4,768,008 | A | | 8/1988 | Purcell et al. | 335/216 |
| 4,782,671 | A | * | 11/1988 | Breneman et al. | 62/51.1 |
| 4,902,995 | A | * | 2/1990 | Vermilyea | 505/211 |
| 4,924,198 | A | * | 5/1990 | Laskaris | 505/211 |
| 5,410,286 | A | * | 4/1995 | Herd et al. | 335/216 |
| 5,661,445 | A | | 8/1997 | Larson et al. | |
| 6,157,276 | A | | 12/2000 | Hedeen et al. | |
| 6,437,568 | B1 | | 8/2002 | Edelstein et al. | |
| 7,053,740 | B1 | * | 5/2006 | Laskaris et al. | 335/216 |
| 7,518,370 | B2 | * | 4/2009 | Huang et al. | 324/319 |
| 2003/0011452 | A1 | * | 1/2003 | Snitchler et al. | 335/216 |
| 2004/0119472 | A1 | | 6/2004 | Laskaris et al. | |
| 2006/0131981 | A1 | * | 6/2006 | Bray et al. | 310/216 |

OTHER PUBLICATIONS

Trifon Laskaris et al., "A Compact 0.8T Superconducting MRI Magnet", Cryogenics, Elsevier, Kidlington, GB, vol. 34, No. ICEC-SUPPL, Jun. 7, 1994, pp. 635-638, XP000511595, ISSN: 0011-2275.
Edelstein W. A. et al., "Making MRI Quieter", Magnetic Resonance Imaging, Tarrytown, NY, US, vol. 20, No. 2, Feb. 2002, pp. 155-163, XP001156677, ISSN: 0730-725X.

* cited by examiner

*Primary Examiner*—Elvin G Enad
*Assistant Examiner*—Mohamad A Musleh
(74) *Attorney, Agent, or Firm*—Patrick K. Patnode

(57) ABSTRACT

A composite sealed vessel is provided. The vessel includes a non-metallic, generally cylindrical inner containment piece, a non-metallic, generally cylindrical outer containment piece disposed around the inner containment piece. A pair of non-metallic flanges are disposed at ends of the inner and outer containment pieces to form a closed structure defining a cavity therein. The vessel also includes a metallic external lining disposed over the closed structure to form a leak-tight pressure boundary.

27 Claims, 6 Drawing Sheets

THIN METAL LAYER VACUUM VESSELS WITH COMPOSITE STRUCTURAL SUPPORT

BACKGROUND

The invention relates generally to medical imaging systems, and more particularly to a composite structure for use in a magnetic resonance imaging system and a method of manufacturing the same.

The vacuum vessel of an MRI magnet is generally made of components that are welded together during assembly of the magnet to form a pressure boundary. Therefore, the function of the vacuum vessel of an MRI magnet is to provide a reliable pressure boundary for maintaining proper vacuum operation. Any leakage or gas permeation over time will increase the vacuum pressure and, consequently, increase the heat load of the magnet.

Vacuum vessels known in the art are usually made of metals such as stainless steel, carbon steel and aluminum. Although, metal vacuum vessels are strong enough to resist vacuum forces, they generate eddy currents and unwanted field distortions in the imaging volume when exposed to an AC field.

Attempts have been made to construct non-metallic vacuum vessels. However, non-metallic vacuum vessels tend to be permeable to gasses and moisture, which hampers the normal vacuum operation.

Similarly, attempts have been made to use thin metallic foils over the non-metallic vacuum composite structures for providing vapor barrier. One major disadvantage with such composite structures is that the metallic foils may not seal properly at the flange joints of the vacuum composite structures.

Thus, there is a need for an impermeable vacuum composite structure that provides reduced field effects from eddy currents.

SUMMARY

In accordance with one aspect of the present technique, a composite sealed vessel is provided. The vessel includes a non-metallic, generally cylindrical inner containment piece, a non-metallic, generally cylindrical outer containment piece disposed around the inner containment piece. A pair of non-metallic flanges are disposed at ends of the inner and outer containment pieces to form a closed structure defining a cavity therein. The vessel also includes a metallic external lining disposed over the closed structure to form a leak-tight pressure boundary. A method for manufacturing the composite sealed vessel is also provided. Further, a system for reducing eddy current losses in a magnetic resonance (MR) system is also provided.

In accordance with another aspect of the present technique, a composite sealed vessel is provided. The composite sealed vessel includes a non-metallic inner containment piece, and two non-metallic flanges coupled to the edges of the inner containment piece to form a composite structure having a cavity therein. An external lining is disposed over the composite structure to form a closed composite structure having a leak tight pressure boundary for maintaining a vacuum pressure within the cavity, wherein the external lining comprises thin metallic sheets welded over the inner containment piece and the two flanges, and a thick metallic sheet forming an outer containment piece.

These and other advantages and features will be more readily understood from the following detailed description of preferred embodiments of the invention that is provided in connection with the accompanying drawings.

DETAILED DESCRIPTION OF EXEMPLARY EMBODIMENTS

In the subsequent paragraphs, an approach for manufacturing a superconducting magnet assembly will be explained in detail. The approach described hereinafter produces a superconducting magnet structure with reduced eddy current and eddy current induced magnetic field, such as for motors, generators, power superconducting magnetic energy storage applications, and magnetic resonance (MR) applications, including nuclear magnetic resonance spectroscopy (NMR) applications, magnetic resonance imaging (MRI) or magnetic resonance spectroscopy. The various aspects of the present technique will be explained, by way of example for an exemplary MR application, with the aid of figures hereinafter. Although the present techniques will be explained with reference to an MR application, it should be appreciated that the teachings of the present techniques may be applied to other applications where AC losses need to be contained for efficient operation.

Figure 1:
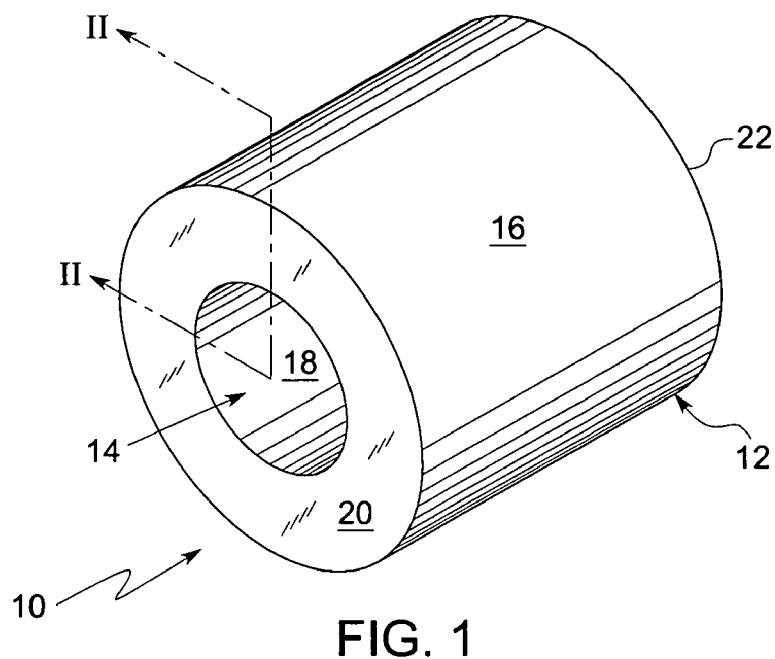
FIG. 1 is a perspective view of a magnet assembly in accordance with aspects of the present technique.

Referring generally to FIG. 1, manufacturing techniques will be described by reference to a magnet assembly designated generally by numeral 10. The magnet assembly 10 includes an outer shell (vessel) 12 surrounding a bore 14. As will be appreciated by those skilled in the art, in an imaging application, a subject is placed in the bore 14 for imaging. Thus, the bore 14 provides access to the imaging volume for a subject. The outer shell 12 includes an outer lining 16, an inner lining 18, and two annular end lining flanges 20 and 22. The outer lining 16, inner lining 18, and the two annular end lining flanges 20 and 22 together form a closed composite structure that encloses an evacuated volume as described below.

Figure 2:
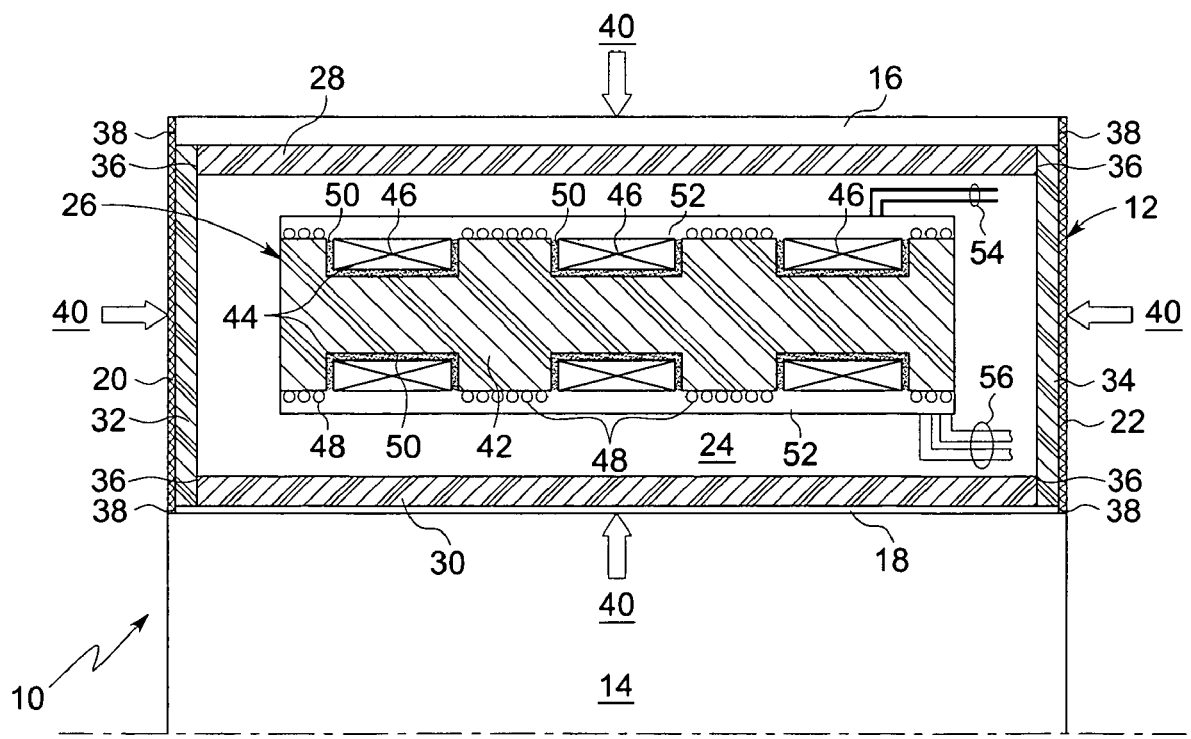
FIG. 2 is a cross-sectional view of the magnet assembly of FIG. 1 taken along line II-II of FIG. 1.

Referring now to FIG. 2, a cross-sectional view of the magnet assembly 10 of FIG. 1 taken along line II-II of FIG. 1, is illustrated. As illustrated, the magnet assembly 10 includes the outer shell 12 surrounding the bore 14. The outer shell 12 is constructed to enclose a vacuum volume or a vacuum cavity 24. Within the vacuum cavity 24, a superconducting magnet assembly 26 is disposed. The outer shell 12 is constructed by disposing a composite outer cylinder 28 over a composite inner cylinder 30 in a concentric fashion. The composite outer cylinder 28 and the composite inner cylinder 30 are closed via two annular flanges 32 and 34, to form a closed composite structure. The composite outer cylinder 28, the composite inner cylinder 30, and the two flanges 32 and 34 may be made of a plastic or fiber material, such as but not limited to, a fiberglass material, a ceramic material, or a synthetic plastic material. Therefore, the two flanges 32 and 34 may be either thermally fused together or even separably joined with the composite outer cylinder 28 and the composite inner cylinder 30 at corners shown generally by reference numeral 36.

The closed composite structure thus formed is then surrounded and sealed by thin metallic sheets that form an external lining over the closed composite structure. An outer metallic lining 16 is disposed proximate to the composite outer cylinder 28, while an inner metallic lining 18 is disposed proximate to the composite inner cylinder 30. Two annular end linings 20 and 22 are disposed proximate to the flanges 32 and 34, respectively. The outer metallic lining 16, the inner metallic lining 18, and the two annular end linings 20 and 22 may be made of metal, such as stainless steel, carbon steel, or aluminum. These components 16, 18, 20, and 22 may be welded together at the edges, as designated generally by reference numeral 38. Thus, the outer shell 12 is a sealed vacuum vessel enclosing the vacuum volume 24, which withstands vacuum forces shown generally by arrows 40.

It may be noted that the magnetic field of MR magnet and gradient assembly 10, particularly important within bore 14, is less influenced to a large extent by metallic lining at the outer periphery 16. Therefore, the outer metallic lining 16 may be thicker than the inner metallic lining 18. The metallic lining at the outer periphery 16 is further away from the gradient coil and the imaging volume 14, and therefore is exposed to smaller gradient pulsing field, causing smaller field disturbance in the imaging volume 14. The thickness of the metallic lining depends upon the particular application, however, and is therefore a matter of design choice. The thickness of the metallic lining is determined by the eddy current skin-depth, which permits the lower frequency fields to penetrate through the sheet, while reflecting the higher frequency fields. The actual cut-off frequency is determined by the resistivity of the material and its thickness. For example, the various metallic lining elements, for this MR magnet assembly 10, may be of a thickness of the order of a fraction of a millimeter of stainless steel for the inner metallic lining 18, and 1 to 2 millimeter of stainless steel for the outer metallic lining 16. This thickness allows lower frequency fields, of less than about 100 Hz, to pass through.

Similarly, in various other applications, the design frequency cut-off depends on the particular application. For example, in a motor or generator this frequency may be about 100 Hz to about 500 Hz; for a power superconducting magnetic energy storage application, from about 500 Hz to about 5 kHz; and, for a nuclear magnetic resonance spectroscopy (NMR) system, the range may be between about 2 kHz and about 10 kHz.

The superconducting magnet assembly 26 is disposed within the outer shell 12 in the vacuum volume 24 via mechanically support structures that are not shown for clarity. The superconducting magnet assembly 26 includes a composite bobbin-shaped structure 42, which includes a plurality of recesses 44. The composite bobbin 42 may be made of thermally conductive strands, such as copper, that may be co-wound, intertwined, with fiberglass strands and reinforced with, but not limited to, epoxy to form a composite body.

In each of the recesses 44, is disposed a superconducting coil 46, which may be made of a coil of metallic or ceramic wires, such as of Niobium-Titanium wires. The superconducting coil 46 wound in each recess 44 may be interlinked with that disposed in another proximate recess 44, via electrical couplers or jumpers. A cryogenic coil 48 is wound or disposed over the composite bobbin 42, such that the cryogenic coil 48 is proximate to the composite bobbin 42 in locations not including the recesses 44.

As previously described, the superconducting coil 46 is wound in the recesses 44 of the composite bobbin 42. Each segment of the superconducting coil 46 disposed in each recess 44 may be disposed over an insulating liner 50 that prevents the superconducting coil 46 to be electrically coupled to the composite bobbin 42. The insulating liner 50 may be an epoxy liner, or other electrically insulating material. It may be noted that the wires of the superconducting coil 46 may also be coated with an insulating material. The structure thus formed is coated with a potting material 52 that forms a uniform overlayer. Leads of the superconducting coil 46, shown generally by reference numeral 54, and conduits of the cryogenic coil 48, shown generally by reference numeral 56, may be conducted out of the potting 52 for electrical coupling with magnet operation control circuitry and cryogen feed mechanism (not shown), respectively.

Figure 3:
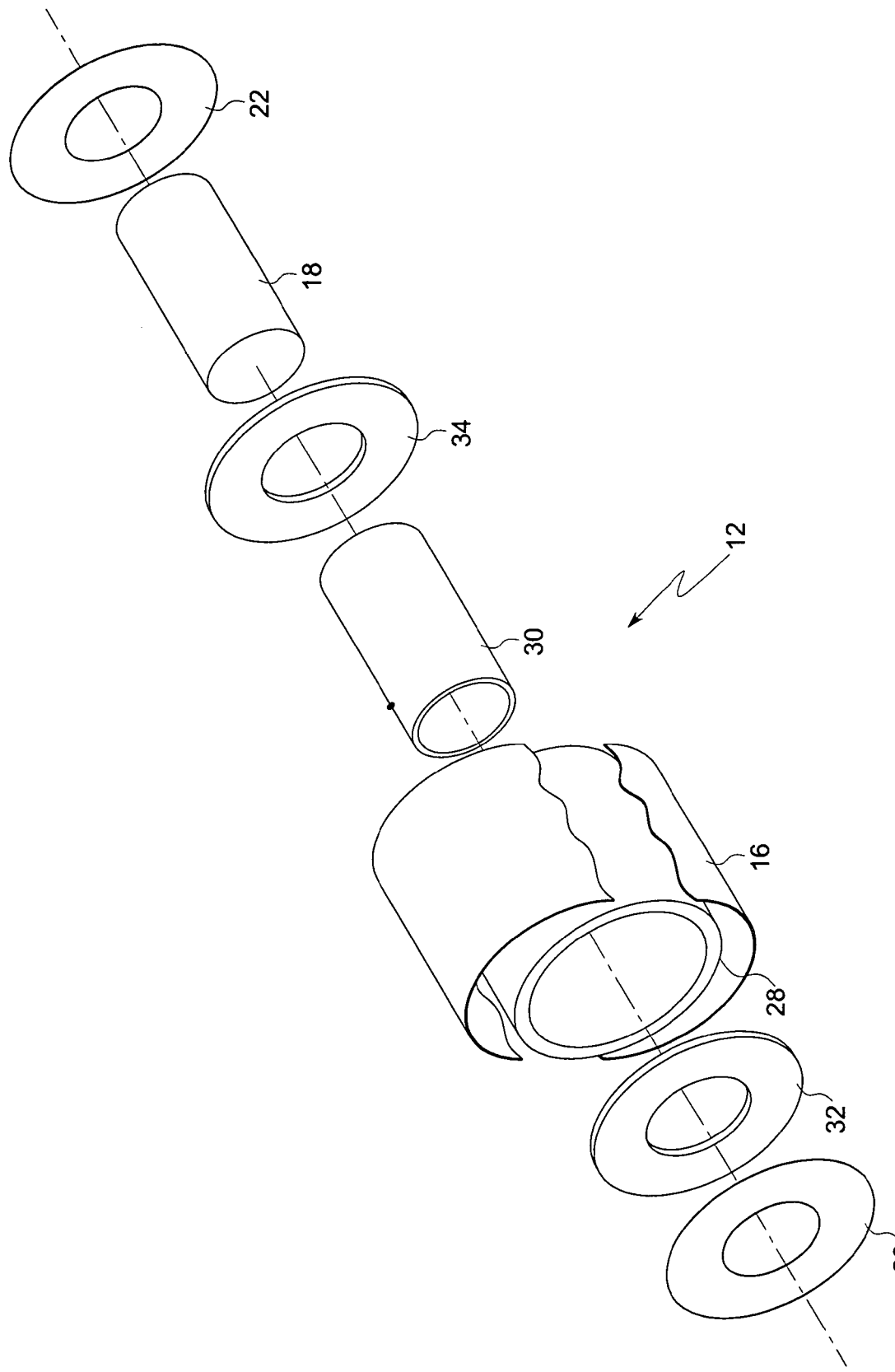
FIG. 3 is an exploded view of an outer shell (vessel) of the magnet assembly of FIG. 1 in accordance with aspects of the present technique.

Turning now to FIG. 3, an exploded view of an outer shell 12 of the magnet assembly 10 of FIG. 1 is shown. As illustrated, the outer shell 12 includes a composite outer cylinder 28 and a composite inner cylinder 30 that are arranged concentric to each other with respect to their central axes. Two annular flanges 32 and 34 are arranged axially to the composite cylinders 28 and 30, such that the annular flanges 32 and 34 and the composite cylinders 28 and 30 together form the closed composite structure enveloping an annular inner volume. It may be noted that the diameter of the composite outer cylinder 28, and the outer diameters of the annular flanges 32 and 34 are the same. Similarly, the diameter of the composite inner cylinder 30, and the inner diameters of the annular flanges 32 and 34 are the same.

A thin outer metallic lining 16 having diameter substantially equal to the outer diameter of the composite outer cylinder 28 is arranged radially over the composite outer cylinder 28. Another thin inner metallic lining 18 having diameter substantially equal to the inner diameter of the composite inner cylinder 30 is also arranged radially within the composite inner cylinder 30. These metallic linings 16 and 18 are then welded together with two annular end linings 20 and 22, which are also arranged axially to the metallic linings 16 and 18. As noted above, the outer metallic lining 16 may be thicker than the inner metallic lining 18. Moreover, welding of these metallic sheets 16, 18, 20, and 22 ensures the outer shell thus formed to be vacuum-sealed. Because the metallic sheets alone are not sufficiently strong to withstand the forces resulting from the pressure difference across the vessel wall when a vacuum is drawn within the vessel, the underlying composite material provides the necessary strength. At the same time, the lining provides an air-tight boundary to prevent leakage into the vessel through the composite material. The use of thin metal reduces the influence of AC fields on the overall structure.

Figure 4:
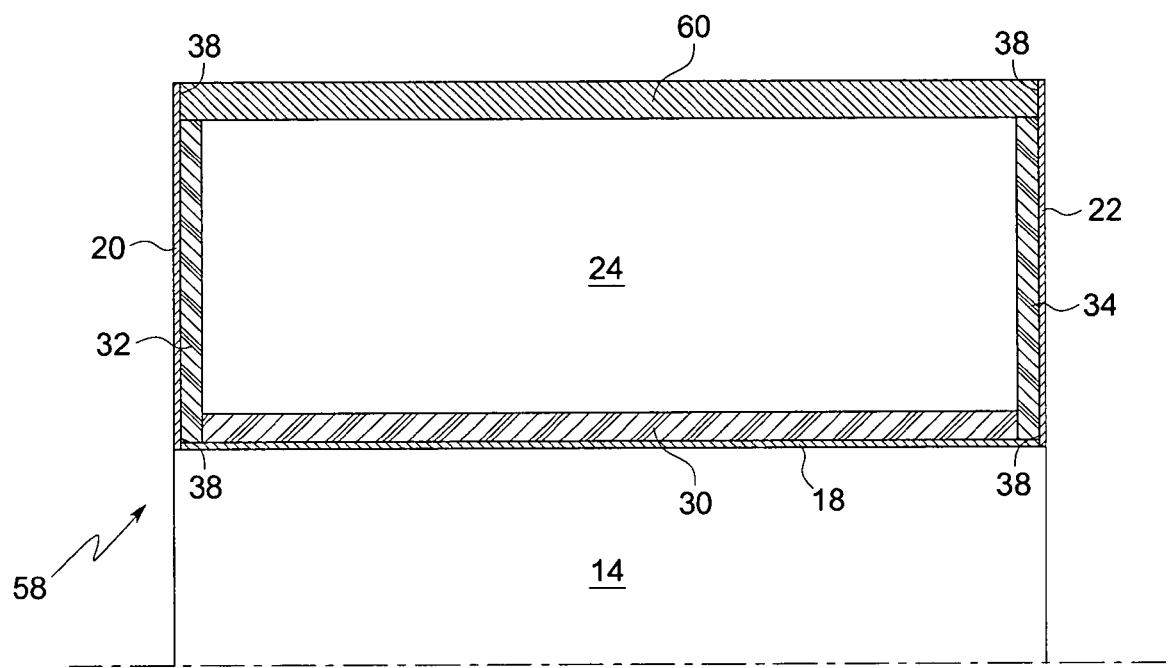
FIG. 4 is a cross-sectional view of an alternative embodiment of the outer shell (vessel) taken along line II-II of FIG. 1 in accordance with aspects of the present technique.

FIG. 4 is a cross-sectional view of an alternative embodiment of an outer shell 58 for use in the magnet assembly of FIG. 1. As illustrated, the outer shell 58 includes a composite inner cylinder 30, and an outer metallic cylinder 60. The composite inner cylinder 30 and the outer metallic cylinder 60 are joined using annular flanges 32 and 34. An inner lining 18, two annular metallic linings 20 and 22 are then welded together at the joints or corners 38. The outer shell thus formed includes a bore 14, as shown. Although, the outer cylinder 60 is made of a metal, the metal cylinder is less influenced by AC fields superimposed on the strong magnetic field generated by the superconducting magnet assembly 26 that is disposed within the vacuum cavity 24. This is because the magnetic field is directed towards the centre into the bore. The outer cylinder 60 is thus relatively spaced from the more important portion of the field.

Figure 5:
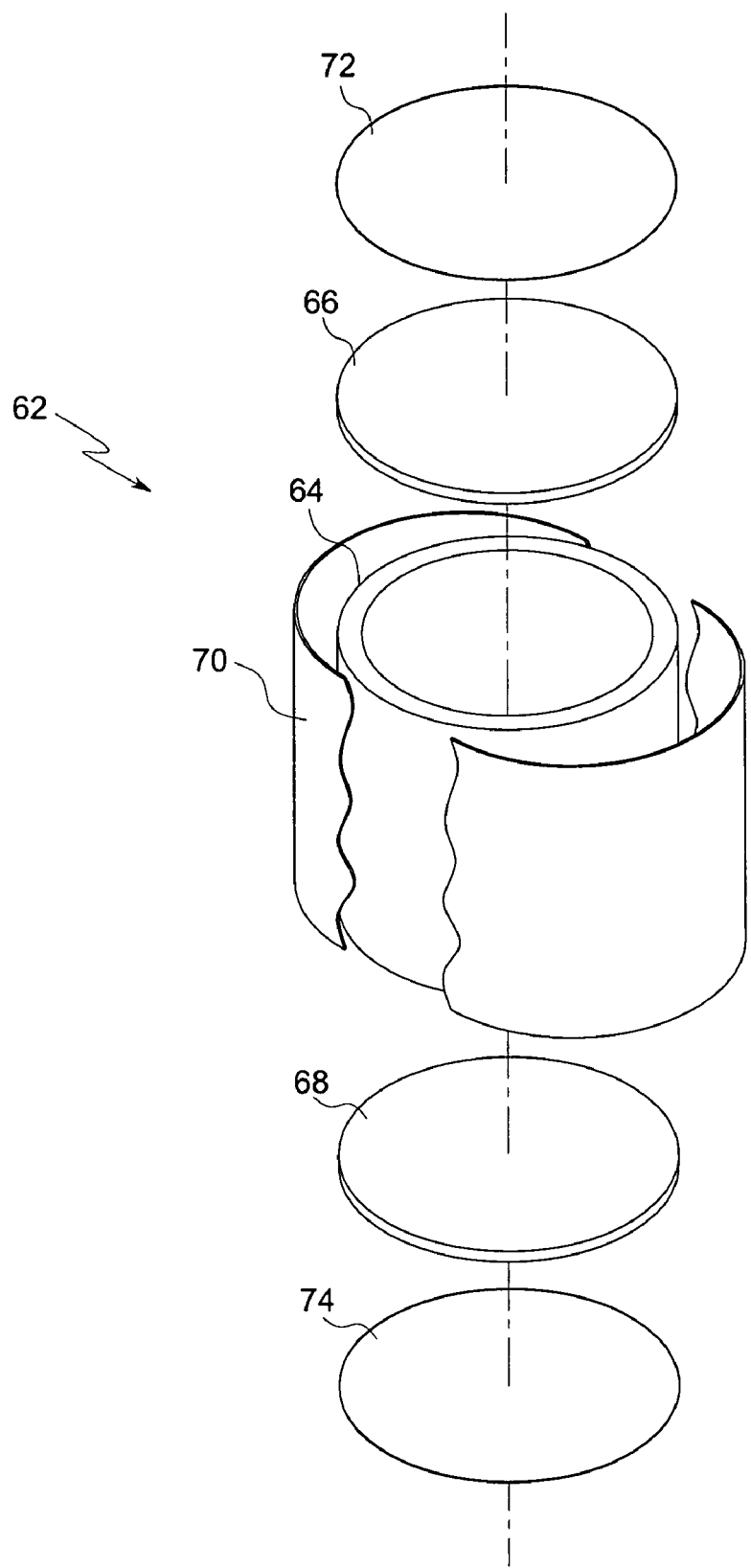
FIG. 5 is an exploded view of an alternative embodiment of an outer shell for use in a magnet assembly in accordance with aspects of the present technique.

Referring generally to FIG. 5, an exploded view of an alternative embodiment of an outer shell 62 for use in a magnet assembly is shown. The outer shell 62 is constructed using a composite cylinder 64, which is joined together via two flanges, an upper composite flange 66, and a lower composite flange 68. The composite cylinder 64 and the composite flanges 66 and 68 may be made of a fiber or plastic material, such as fiberglass, ceramic, or plastic. These components 64, 66, and 68 may be thermally fused or joined to form a closed pancake-shaped structure. A thin metallic outer lining 70 having an inner diameter substantially equal to the outer diameter of the composite cylinder 64 is then welded with two metallic discs, an upper metallic lining 72 and a lower metallic lining 74. The outer shell 62 thus formed includes a vacuum volume or a vacuum cavity, within which is disposed a superconducting magnet assembly. Such a magnet assembly may be utilized for an open MR system, such as an open MRI or open magnetic resonance spectroscopy systems.

Figure 6:
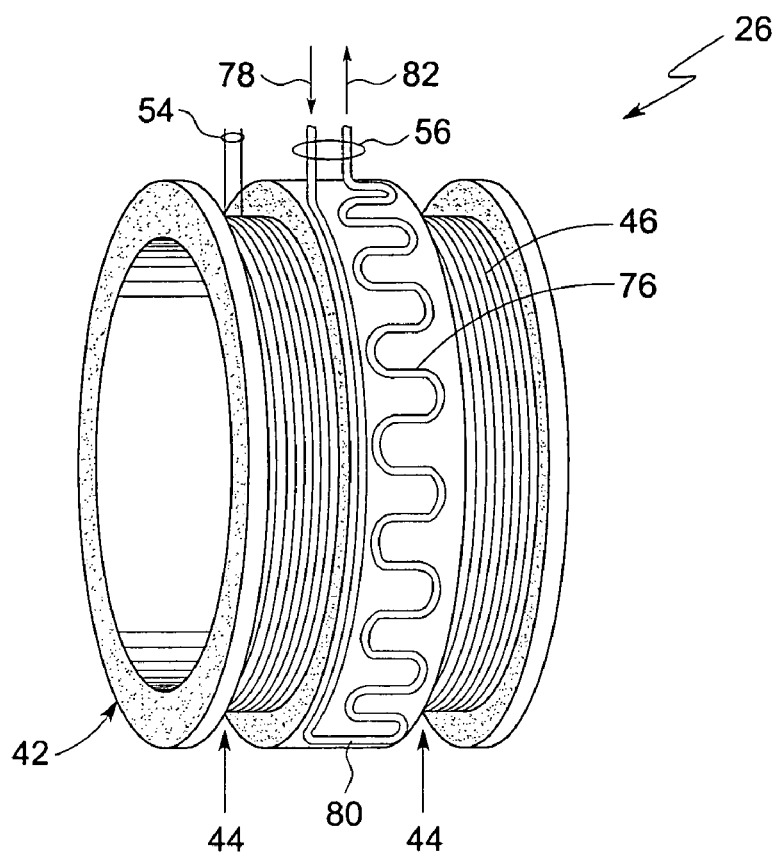
FIG. 6 is a diagrammatic view of a horizontally-oriented superconducting magnet in accordance with aspects of the present technique.

FIG. 6 is a diagrammatic view of a superconducting magnet that may be disposed horizontally within an outer shell of a magnet assembly in an MR system. As shown, the composite bobbin 42 of the superconducting magnet assembly 26 includes recesses 44. Although only two recesses 44 are shown, the composite bobbin 42 may include more recesses. The recesses 44 are wound with a superconducting coil 46. The superconducting coil 46 in the two recesses 44 are joined together via jumpers or electrical coupling that runs over the composite bobbin 42. Leads 54 of the superconducting coil 46 are conducted to electrical coupling with a magnet operation control circuitry. A cryogen coil 76 is arranged over the composite bobbin 42 in an anti-vapor-locking configuration, as shown. For example, in a horizontally-oriented superconducting magnet structure 26, the cryogen coil 76 may be disposed in a commonly known refrigerator cooling coil configuration. This refrigerator cooling coil configuration in the horizontally-oriented superconducting magnet structure 26 prevents vapor-locking of the cryogen, as will be appreciated by those skilled in the art. The cryogen feed mechanism feeds liquid helium, or other cryogen known in the art, into the cryogen coil 76 in a direction shown generally by reference numeral 78. The cryogen flows down into the bottom 80 of the cryogen coil 76. As the cryogen cools the superconducting magnet 26, the cryogen vaporizes and passes through the serpentine cryogen coil 76, without any cryogen vapor being locked in the cryogen coil 76. The vaporized cryogen escapes into the cryogen feed mechanism in the direction generally shown by reference numeral 82.

The composite bobbin 42, made of thermally conductive material, as described previously helps in conducting heat away from the superconducting coils thus maintaining superconducting operation. The generated heat is conducted away towards the cryogenic coil 48. The thermally conductive composite bobbin 42 therefore reduces the thermal gradient between the superconducting coil 46 and the cryogenic coil 48.

Figure 7:
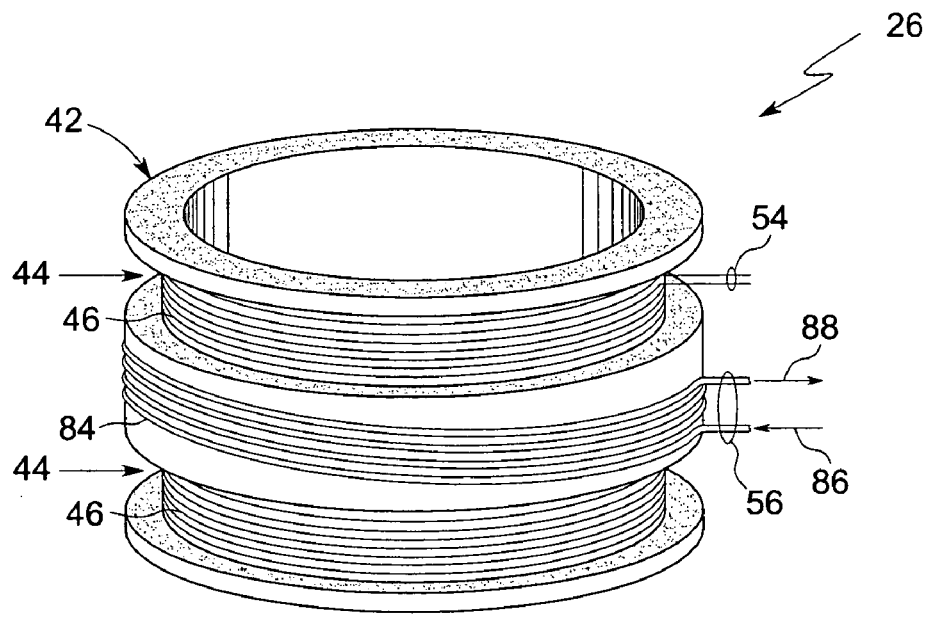
FIG. 7 is a diagrammatic view of a vertically-oriented superconducting magnet in accordance with aspects of the present technique.

FIG. 7 is a diagrammatic view of a superconducting magnet that may be disposed vertically within an outer shell of a magnet assembly in an MR system. FIG. 7 shows the composite bobbin 42 of the superconducting magnet assembly 26 including the recesses 44. As shown, cryogen coil 84 is arranged over the composite bobbin 42 in an anti-vapor-locking configuration. In this vertically-oriented superconducting magnet structure 26, the cryogen coil 84 is disposed in a helical configuration. Again, this helical configuration in the vertically-oriented superconducting magnet structure 26 prevents vapor-locking of the cryogen. The cryogen feed mechanism feeds cryogen into the cryogen coil 84 in a direction shown generally by reference numeral 86. The cryogen cools the superconducting magnet 26 and vaporizes through the spiral cryogen coil 84. The vaporized cryogen escapes into the cryogen feed mechanism in the direction generally shown by reference numeral 88.

Figure 8:
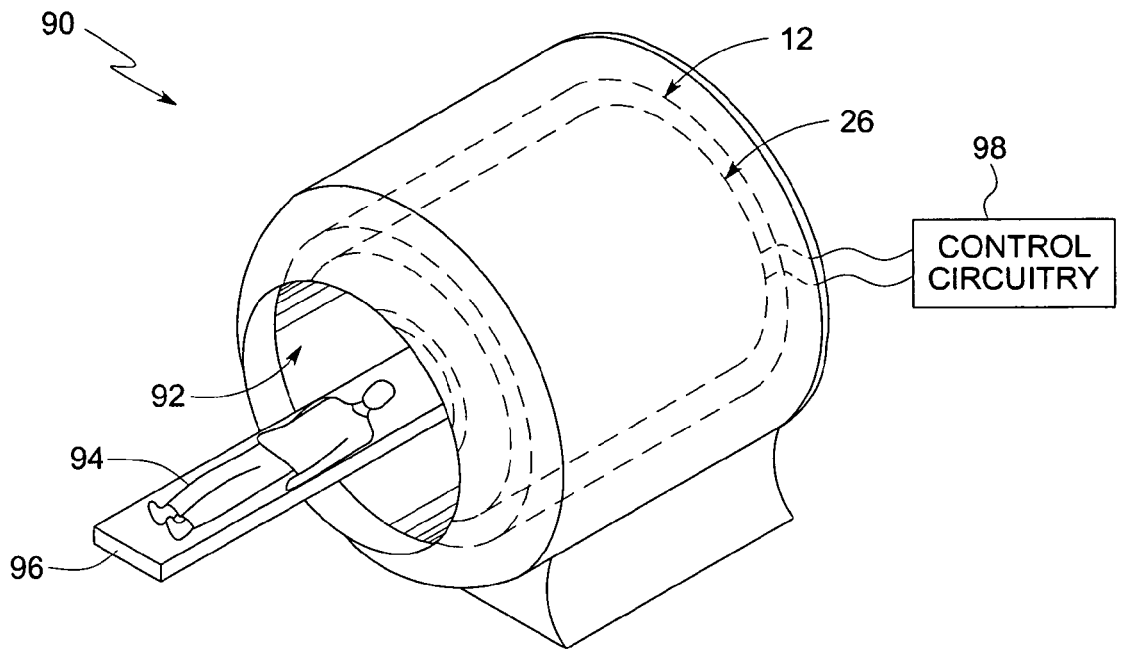
FIG. 8 is a diagrammatic representation of a closed MR system illustrating a superconducting magnet assembly disposed within the MR system in accordance with aspects of the present technique.

The forgoing structures may be used in a range of systems and applications, such as for magnetic resonance imaging. Referring generally to FIG. 8, a magnetic resonance (MR) system 90, such as for a magnetic resonance imaging or magnetic resonance spectroscopy application, is shown in which the forgoing structures are incorporated. The MR system 90 shows a closed MR system, having a bore 92 for receiving a subject 94. Subject 94 may lie over a patient table 96 that may be introduced into the bore 92. A magnet assembly 10 including a superconducting magnet assembly 26 made via the techniques discussed above may be utilized to generate the magnetic field for the MR system 90. The superconducting operation may be controlled via an imaging control circuitry 98.

Figure 9:
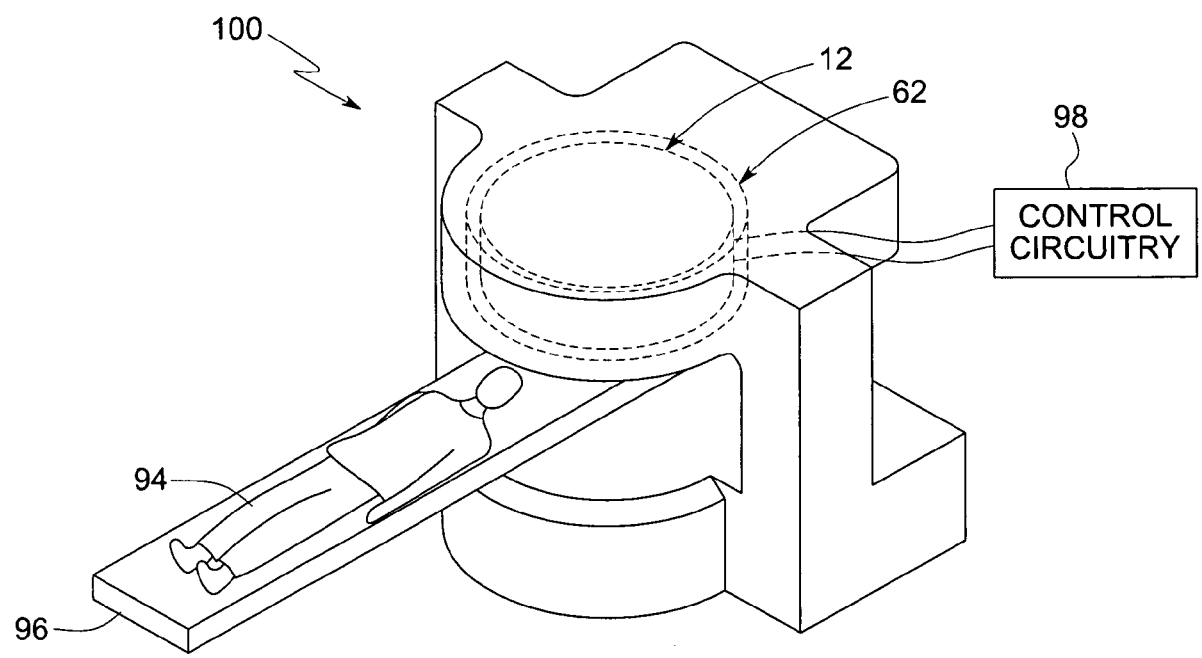
FIG. 9 is a diagrammatic representation of an open MR system illustrating a superconducting magnet assembly disposed within the MR system in accordance with aspects of the present technique.

Referring now to FIG. 9, an open MR system 100 is shown. The magnetic field for the open MR system 100 may be generated by a magnet assembly 10. The magnet assembly 10 may include an outer shell 62, constructed in accordance with the teachings of FIG. 5. Within the outer shell 62, a superconducting magnet assembly 26 may be disposed, which may have a thick disc shape without a bore. Again, the superconducting operation may be controlled via an imaging control circuitry 98.

Although the embodiments illustrated and described hereinabove represent only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the magnet assembly 10 including the outer shell 12 that encloses the superconducting magnet assembly 26, may be constructed in a conventional patient bore configuration, an open MRI configuration, a long-U configuration, among others.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A composite sealed vessel, comprising:
   a non-metallic, generally cylindrical inner containment piece;

a non-metallic, generally cylindrical outer containment piece disposed around the inner containment piece;

a pair of non-metallic flanges disposed at ends of the inner and outer containment pieces to form a closed structure defining a cavity therein; and a metallic external lining directly adjacent to and disposed over the external surfaces of the closed structure which includes said inner containment piece, said outer containment piece and said flanges, to form a leak-tight pressure boundary.

2. The composite sealed vessel of claim 1, wherein the inner containment piece comprises one of a fiberglass material, carbon fiber material, or a ceramic material.

3. The composite sealed vessel of claim 1, wherein the outer containment piece comprises one of a fiberglass material, carbon fiber material, or a ceramic material.

4. The composite sealed vessel of claim 1, wherein the pair of flanges comprises one of a fiberglass material, carbon fiber material, or a ceramic material.

5. The composite sealed vessel of claim 1, wherein the closed structure is formed by joining the inner containment piece, the outer containment piece, and the flanges.

6. The composite sealed vessel of claim 1, wherein the metallic external lining comprises thin high-resistivity metallic sheets welded together over exterior surfaces of the closed structure.

7. The composite sealed vessel of claim 1, wherein the metallic external lining comprises a thick high-resistivity metallic sheet proximate to the outer containment piece of the closed structure.

8. The composite sealed vessel of claim 1, wherein the metallic external lining allows low frequencies to penetrate through and shields high frequencies.

9. The composite sealed vessel of claim 1, wherein the closed structure is configured to support the metallic external lining when a vacuum pressure is drawn in the cavity.

10. The composite sealed vessel of claim 1, comprising a superconducting magnet disposed in the cavity.

11. A method for manufacturing a composite sealed vessel, comprising:

disposing a non-metallic inner containment piece and a non-metallic outer containment piece in a concentric configuration;

forming a closed composite structure by coupling the non-metallic inner containment piece and the non-metallic outer containment piece via two non-metallic flanges; and layering the closed composite structure with a sealed thin metallic external lining for forming a leak-tight pressure boundary around the closed composite structure, wherein the metallic external lining directly adjacent to and disposed over the external surfaces of the closed structure which includes said inner containment piece, said outer containment piece and said flanges, to form a leak-tight pressure boundary.

12. The method of claim 11, wherein disposing the non-metallic inner containment piece comprises disposing a non-metallic inner containment piece made using one of a fiberglass material, carbon fiber material, or a ceramic material.

13. The method of claim 11, wherein disposing the non-metallic outer containment piece comprises disposing a non-metallic outer containment piece made using one of a fiberglass material, carbon fiber material, or a ceramic material.

14. The method of claim 11, wherein coupling the inner containment piece and the outer containment piece via two non-metallic flanges comprises coupling the inner containment piece and the outer containment piece via two non-metallic flanges made using one of a fiberglass material, carbon fiber material, or a ceramic material.

15. The method of claim 11, wherein the step of layering comprises disposing a metallic external lining around the closed structure.

16. The method of claim 11, wherein the step of layering comprises disposing a metallic outer lining around the non-metallic outer containment piece.

17. The method of claim 11, wherein the step of layering comprises disposing a metallic inner lining around the non-metallic inner containment piece.

18. The method of claim 11, wherein the step of layering comprises disposing two annular metallic linings proximate to the two annular non-metallic flanges.

19. The method of claim 18, wherein forming the leak-tight pressure boundary comprises welding the two annular metallic linings with the metallic outer lining and the metallic inner lining.

20. A system for reducing eddy current losses in a magnetic resonance (MR) system, comprising:

a superconducting magnet assembly disposed within a composite sealed vessel, the composite sealed vessel including:

a non-metallic, generally cylindrical inner containment piece;

a non-metallic, generally cylindrical outer containment piece disposed around the inner containment piece;

a pair of non-metallic flanges disposed at ends of the inner and outer containment pieces to form a closed structure defining a cavity therein; and a metallic external lining directly adjacent to and disposed over the external surfaces of the closed structure which includes said inner containment piece, said outer containment piece and said flanges, to form a leak-tight pressure boundary;

a patient table for supporting a patient;

a plurality of gradient coils disposed adjacent to the superconducting magnet assembly; and an imaging circuitry for controlling operation of the system.

21. A composite sealed vessel, comprising:

a composite structure comprising a non-metallic inner containment piece and a non-metallic outer containment piece in a concentric configuration via two non-metallic flanges, wherein the non-metallic inner containment piece, the non-metallic outer containment piece and the two non-metallic flanges define a cavity therein;

an external lining disposed over the composite structure to form a closed composite structure having a leak tight pressure boundary for maintaining a vacuum pressure within the cavity, wherein the external lining comprises thin metallic sheets welded over the inner containment piece and the two flanges, and a thick metallic sheet forming an outer containment piece, wherein the metallic external lining directly adjacent to and disposed over the external surfaces of the closed structure which includes said inner containment piece, said outer containment piece and said flanges, to form a leak-tight pressure boundary.

22. The composite sealed vessel of claim 21, wherein the external lining comprises a metallic outer lining around the non-metallic outer containment piece.

23. The composite sealed vessel of claim 21, wherein the external lining comprises a metallic inner lining around the non-metallic inner containment piece.

24. The composite sealed vessel of claim 21, wherein the external lining comprises two annular metallic linings proximate to the two non-metallic flanges.

25. The composite sealed vessel of claim 21, wherein the metallic external lining allows low frequencies to penetrate through and shields high frequencies.

26. The composite sealed vessel of claim 21, wherein the closed structure is configured to support the metallic external lining when a vacuum pressure is drawn in the cavity.

27. The composite sealed vessel of claim 21, comprising a superconducting magnet disposed in the cavity.

* * * * *